United States Patent
Hsiao

(10) Patent No.: US 11,224,133 B2
(45) Date of Patent: Jan. 11, 2022

(54) TILED DISPLAY DEVICE

(71) Applicant: InnoLux Corporation, Miao-Li County (TW)

(72) Inventor: Yu-Hsuan Hsiao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 28 days.

(21) Appl. No.: 16/837,434

(22) Filed: Apr. 1, 2020

(65) Prior Publication Data

US 2020/0337160 A1  Oct. 22, 2020

Related U.S. Application Data

(60) Provisional application No. 62/835,569, filed on Apr. 18, 2019.

(30) Foreign Application Priority Data

Nov. 12, 2019  (CN) .......................... 201911100379.2

(51) Int. Cl.
| | |
|---|---|
| *H05K 7/02* | (2006.01) |
| *H05K 7/04* | (2006.01) |
| *H05K 5/00* | (2006.01) |
| *H05K 5/02* | (2006.01) |

(52) U.S. Cl.
CPC .......... *H05K 5/0017* (2013.01); *H05K 5/0021* (2013.01); *H05K 5/02* (2013.01)

(58) Field of Classification Search
USPC ........................................ 361/807, 809, 810
See application file for complete search history.

(56) References Cited

U.S. PATENT DOCUMENTS

| | | | | |
|---|---|---|---|---|
| 5,889,568 | A * | 3/1999 | Seraphim | G02F 1/13336 349/73 |
| 11,023,194 | B2 * | 6/2021 | Schwarz | G09G 3/32 |
| 2008/0297021 | A1 * | 12/2008 | Hwang | H01J 9/205 313/112 |
| 2013/0162504 | A1 * | 6/2013 | Kawano | G06F 3/1446 345/1.3 |
| 2017/0017453 | A1 * | 1/2017 | Hoshino | G09G 3/32 |
| 2019/0159339 | A1 * | 5/2019 | Lee | H05K 1/09 |
| 2020/0083315 | A1 * | 3/2020 | Yueh | H01L 51/529 |
| 2020/0271971 | A1 * | 8/2020 | Su | G02F 1/133308 |

FOREIGN PATENT DOCUMENTS

CN  105869537 A  8/2016

OTHER PUBLICATIONS

Chinese language office action dated Sep. 8, 2021, issued in application No. CN 201911100379.2.

* cited by examiner

*Primary Examiner* — Hung S. Bui
(74) *Attorney, Agent, or Firm* — McClure, Qualey & Rodack, LLP

(57) ABSTRACT

A tiled display device is provided. The tiled display device includes a main supporting substrate, a first display substrate and a second display substrate. The first display substrate is disposed on the main supporting substrate. The second display substrate is disposed on the main supporting substrate and adjacent to the first display substrate. In addition, the main supporting substrate includes a light reflection reduction structure. In a top-view direction of the tiled display device, the light reflection reduction structure is overlapped with the gap between the first display substrate and the second display substrate.

20 Claims, 10 Drawing Sheets

TILED DISPLAY DEVICE

CROSS REFERENCE TO RELATED APPLICATIONS

This application claims priority of U.S. Provisional Patent Application No. 62/835,569 filed on Apr. 18, 2019, and Chinese Patent Application 201911100379.2, filed on Nov. 12, 2019, the entirety of which are incorporated by reference herein.

BACKGROUND

Technical Field

The present disclosure relates to a tiled display device, and in particular it relates to a tiled display device having an optical structure.

Description of the Related Art

Electronic products equipped with display panels such as smartphones, tablet computers, notebook computers, monitors, and televisions have become indispensable necessities in modern society. With the flourishing development of these portable electronic products, consumers have high expectations regarding their quality, functionality, and price.

The technology behind mini light-emitting diodes and micro light-emitting diodes is related to the flat panel display technologies that have emerged in recent years. Display devices that employ mini light-emitting diodes and micro light-emitting diodes can produce seamless images, with wide viewing angles, high brightness, and high contrast. However, when such technologies are applied to large display panels, most of them need to be tiled together to achieve a display function. As the resolution requirements increase, the pitch between the light-emitting diodes decreases, which also limits the available space at the connection position of the panels.

Although the tiled display devices that currently exist have been adequate for their intended purposes, they have not been satisfactory in all respects. Therefore, the development of a structural design that can improve the quality or reliability of tiled display devices is still one of the goals that the industry is currently aiming at.

SUMMARY

In accordance with some embodiments of the present disclosure, a tiled display device is provided. The tiled display device includes a main supporting substrate, a first display substrate and a second display substrate. The first display substrate is disposed on the main supporting substrate. The second display substrate is disposed on the main supporting substrate and adjacent to the first display substrate. In addition, the main supporting substrate includes a light reflection reduction structure. In a top-view direction of the tiled display device, the light reflection reduction structure is overlapped with the gap between the first display substrate and the second display substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
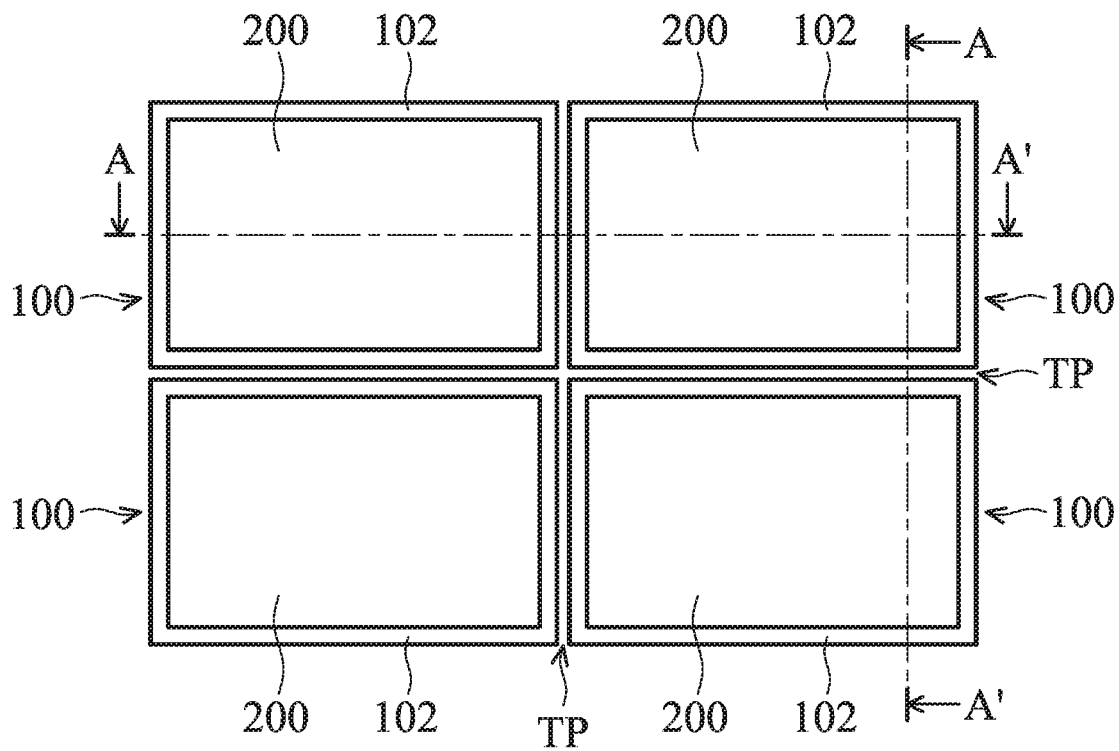
FIG. 1 is a top-view diagram of the tiled display device in accordance with some embodiments of the present disclosure.

The structure of the tiled display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that the descriptions of the exemplary embodiments are intended to be read in connection with the accompanying drawings, which are to be considered part of the entire written description. The drawings are not drawn to scale. In fact, the size of the element may be arbitrarily enlarged or reduced in order to clearly express the features of the present disclosure.

In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

It should be understood that, although the terms first, second, third etc. may be used herein to describe various surfaces, elements, components, regions, layers, or portions, these surfaces, elements, components, regions, layers, or portions should not be limited by these terms. These terms are only used to distinguish one surface, element, component, region, layer, or portion from another surface, element, component, region, layer, or portion. Thus, a first surface, element, component, region, layer, or portion discussed below could be termed a second surface, element, component, region, layer, or portion without departing from the teachings of the present disclosure.

The terms "substantially" typically mean+/−20% of the stated value, or +/−10% of the stated value, or +/−5% of the stated value, or +/−3% of the stated value, or +/−2% of the stated value, or +/−1% of the stated value, or +/−0.5% of the stated value. The stated value of the present disclosure is an approximate value. When there is no specific description, the stated value includes the meaning of "substantially".

In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the provided tiled display device includes an optical structure, and the optical structure can change the path of light or reduce the intensity of light reflection. In some embodiments, the optical structure may be, for example, a light reflection reduction structure. The light reflection reduction structure may reduce the reflected light generated by the ambient light at the connection position (tiled position) of the display, and reduce the interference of the ambient light on the image quality of the display. The following description takes the light reflection reduction structure as an example of the optical structure. The "light reflection reduction" mentioned herein means that the spectral integration value of the reflected light of the light source (e.g., which may be ambient light) is smaller than the spectral integration value of the incident light. In some embodiments, the light source may include visible light (e.g., the wavelength is from 380 nm to 780 nm) or ultraviolet light (e.g., the wavelength is less than 365 nm), but it is not limited thereto. In other words, when the light source is visible light, the spectral integration value of the reflected light in a wavelength ranging from 380 nm to 780 nm is smaller than the spectral integration value of the incident light in the same wavelength range.

Referring to FIG. 1, which is a top-view diagram of a tiled display device 10 in accordance with some embodiments of the present disclosure. It should be understood that only some elements of the tiled display device 10 are illustrated in FIG. 1 for clarity. Furthermore, in accordance with some embodiments, additional features may be added to the tiled display device 10 described below. In some other embodiments, some features of the tiled display device 10 described below may be replaced or omitted.

Figure 2:
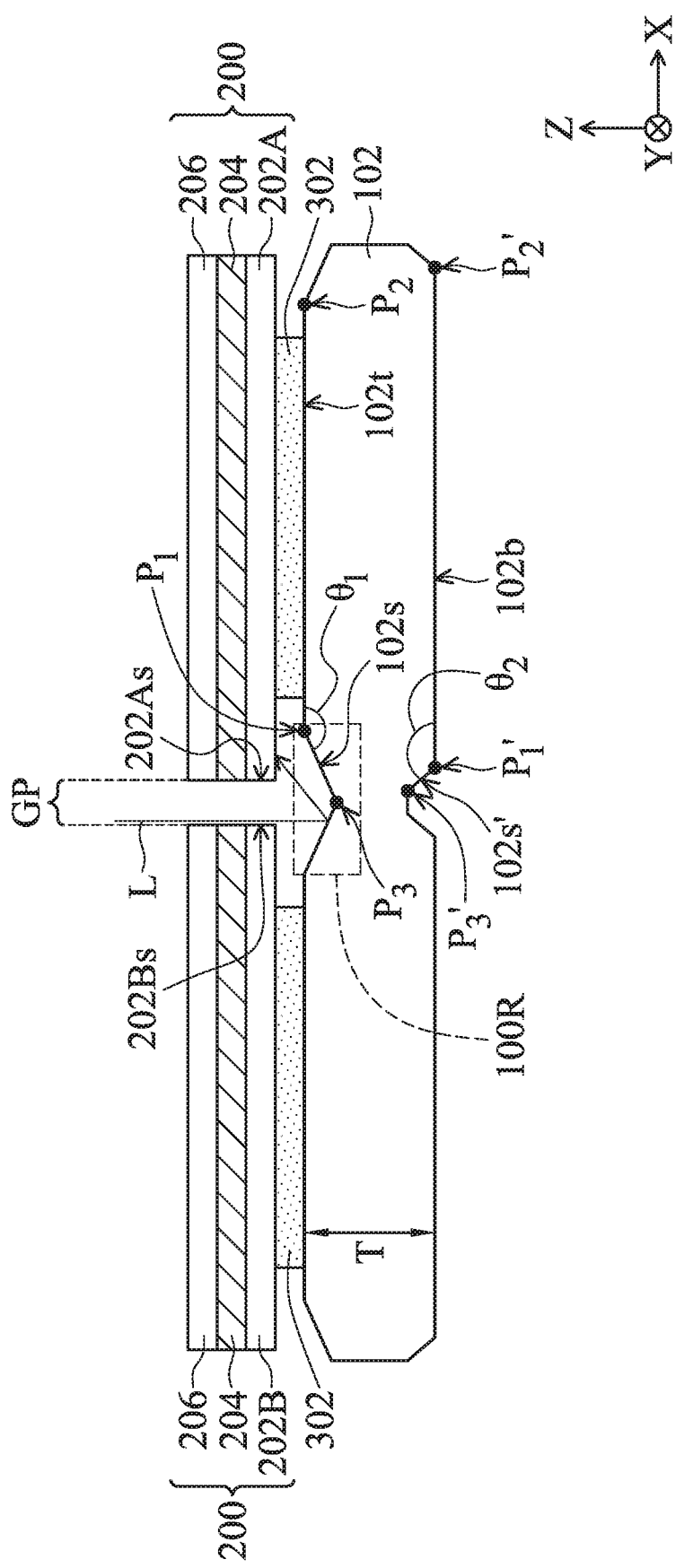
FIGS. 2 to 9 are cross-sectional diagrams along section line A-A' in FIG. 1 in accordance with some embodiments of the present disclosure.

As shown in FIG. 1, in accordance with some embodiments, the tiled display device 10 may include a plurality of display units 100, and the display units 100 may be arranged adjacent to each other. In some embodiments, the display unit 100 may include a main supporting substrate 102 and a display element 200. The display element 200 may be disposed on the main supporting substrate 102. In some embodiments, the size of the main supporting substrate 102 may be larger than the size of the display element 200 (e.g., the display substrate 202A or the display substrate 202B as shown in FIG. 2). For example, in a top-view direction (i.e. top-view perspective) of the tiled display device 10, at least a portion of the main supporting substrate 102 may protrude from the display element 200. For example, the four sides of the main supporting substrate 102 may protrude from the display element 200 along the X direction or the Y direction in the figure, and the main supporting substrate 102 may serve as the main substrate for interconnection between the display units 100. In some embodiments, since the size of the main supporting substrate 102 is larger than the size of the display element 200, a tiled portion TP located between the main supporting substrates 102 may not be covered by the display element 200, and therefore, ambient light may illuminate the tiled portion TP.

Referring to FIG. 2, which is a cross-sectional diagram along section line A-A' in FIG. 1 in accordance with some embodiments of the present disclosure. It should be understood that both the section lines A-A' in FIG. 1 may correspond to the cross-sectional structure shown in FIG. 2, and the same applies to subsequent FIGS. 3 to 9. As shown in FIG. 2, in some embodiments, the tiled display device 10 may include the main supporting substrate 102 and a plurality of display elements 200. The display element 200 may be disposed on the main supporting substrate 102.

In some embodiments, the display element 200 may include a liquid-crystal display (LCD) device, a light-emitting diode (LED) device, a quantum dot device, and a fluorescence device, a phosphor device, a device with other suitable display media, or a combination thereof, but the present disclosure is not limited thereto. In accordance with some embodiments, the light-emitting diode display device may include, for example, an organic light-emitting diode (OLED), a quantum dot light-emitting diode (QLED), a mini light-emitting diode (mini LED), a micro light-emitting diode (micro LED), or a combination thereof, but the present disclosure is not limited thereto.

In addition, in some embodiments, the tiled display device 10 may further include a bonding layer 302 disposed between the main supporting substrate 102 and the display element 200. In some embodiments, the bonding layer 302 may include an adhesive material, a mechanical fixing element, or a combination thereof, but it is not limited thereto.

As shown in FIG. 2, in some embodiments, the display element 200 may include a display substrate (the display substrate 202A or the display substrate 202B), a circuit layer 204, and a display layer 206. In some embodiments, the circuit layer 204 and the display layer 206 may be disposed on the display substrate, and the circuit layer 204 may be disposed between the display substrate and the display layer 206.

It should be understood that, the embodiments shown in the present disclosure are illustrated by using mini light-emitting diodes or micro light-emitting diodes as the display element 200, but the display element 200 may be any one of the aforementioned display elements or a combination thereof in accordance with some embodiments of the present disclosure. In addition, the structure of the display element 200 may be present in various forms or configurations known to those with ordinary skill in the art, and thus will not be repeated herein.

In addition, in order to clearly illustrate the positional relationship of the display substrates and the main supporting substrate 102 in the different display elements 200, the display substrates in the different display elements 200 are labeled herein as a first display substrate 202A and a second display substrate 202B. As shown in FIG. 2, in some embodiments, the first display substrate 202A and the second display substrate 202B may be disposed on the main supporting substrate 102, and the second display substrate 202B may be adjacent to the first display substrate 202A.

In some embodiments, there may be a gap GP between the first display substrate 202A and the second display substrate 202B, and the gap GP may be located in the tiled portion TP. In accordance with some embodiments, the gap GP may refer to the minimum distance between a side surface 202As of the first display substrate 202A and a side surface 202Bs of the second display substrate 202B.

It should be noted that the main supporting substrate 102 may include an optical structure 100R. In some embodiments, in a top-view direction of the tiled display device 10 (e.g., along the Z direction shown in the figure), the optical structure 100R may be at least partially overlapped with the gap GP between the first display substrate 202A and the second display substrate 202B. In accordance with some embodiments, the optical structure 100R may reduce ambient light (e.g., the light L shown in the figure) to generate reflected light at the gap GP (i.e. the tiled portion TP of the display). Specifically, in accordance with some embodiments, the optical structure 100R may reduce the generation of reflected light that passes through the gap GP, reducing the occurrence of bright lines at the gap GP, which can affect image quality.

Specifically, the optical structure 100R may be a structure capable of reducing the intensity of reflected light. In some embodiments, a structure that can reduce the intensity of the reflected light in a certain range of wave band may also serve as the optical structure 100R.

As shown in FIG. 2, in some embodiments, the optical structure 100R may be located in an upper portion of the main supporting substrate 102. In some embodiments, the optical structure 100R may include a recessed structure. In some embodiments, the main supporting substrate 102 may include a top surface 102t and a side surface 102s that is connected to the top surface 102t. In addition, the side surface 102s may not be perpendicular to the top surface 102t, so that the side surface 102s may serve as a part of the optical structure 100R. Specifically, since the side surface 102s and the top surface 102t of the main supporting substrate 102 are not perpendicular (that is, the main supporting substrate 102 has a portion of the inclined surface), the reflection light generated when the light L reaches the main supporting substrate 102 may be effectively reduced.

In addition, the side surface 102s of the main supporting substrate 102 is a side surface that is at least partially overlapped with the gap GP in a top-view direction (e.g., the Z direction). In some embodiments, there may be an included angle $\theta_1$ between the top surface 102t and the side surface 102s of the main supporting substrate 102. In some embodiments, the range of the included angle $\theta_1$ may be greater than 135 degrees and less than 180 degrees (135 degrees<included angle $\theta_1$<180 degrees), or greater than 140 degrees and less than 170 degrees, for example, 145 degrees, 150 degrees, 155 degrees, 160 degrees, or 165 degrees, but it is not limited thereto. In some embodiments, the range of the included angle $\theta_1$ may be greater than 90 degrees and less than 135 degrees (90 degrees<the included angle $\theta_1$<135 degrees), but it is not limited thereto.

Specifically, in accordance with some embodiments, the included angle $\theta_1$ may refer to an included angle that is formed by a connection line between an end point $P_1$ and an end point $P_2$ on the top surface 102t of the main supporting substrate 102 (e.g., the two end points or turning points of the top surface 102t in a cross-sectional structure) and a connection line between the end point $P_1$ and another end point $P_3$ on the side surface 102s (e.g., the end points or turning points of the side surface 102s in a cross-sectional structure).

As shown in FIG. 2, in some embodiments, the lower portion of the main supporting substrate 102 may also include the recessed structure. In some embodiments, the main supporting substrate 102 may include a bottom surface 102b and a side surface 102s' that is connected to the bottom surface 102b. In addition, the side surface 102s' may not be perpendicular to the bottom surface 102b. In accordance with some embodiments, the main supporting substrate 102 has the recessed structure in the lower portion, and thereby the efficiency of the subsequent assembly process of the tiled display device 10 may be improved.

In some embodiments, the side surface 102s' of the main supporting substrate 102 is a side surface that is at least partially overlapped with the gap GP. In some embodiments, there may be an included angle $\theta_2$ between the bottom surface 102b and the side surface 102s' of the main supporting substrate 102. In some embodiments, the range of the included angle $\theta_2$ may be greater than 90 degrees and less than 180 degrees (90 degrees<the included angle $\theta_2$<180 degrees). In some embodiments, the included angle $\theta_2$ may be equal to 90 degrees. In addition, the included angle $\theta_1$ may be the same as or different from the included angle $\theta_2$.

In accordance with some embodiments, the included angle $\theta_2$ may refer to an included angle that is formed by a connection line between an end point $P_1'$ and an end point $P_2'$ on the bottom surface 102b of the main supporting substrate 102 (e.g., the two end points or turning points of the bottom surface 102b in a cross-sectional structure) and a connection line between the end point $P_1'$ and another end point $P_3'$ on the side surface 102s' (e.g., the end points or turning points of the side surface 102s', or the end points or turning points where the side surface 102AS connects the side surface 102s' in a cross-sectional structure).

In addition, in accordance with some embodiments of the present disclosure, an optical microscopy (OM), a scanning electron microscope (SEM), an angle-measuring instrument, or another suitable means may be used to measure the included angle $\theta_1$ and the included angle $\theta_2$, but the present disclosure is not limited thereto. In some embodiments, a scanning electron microscope may be used to obtain a cross-sectional image of the structure, and an angle-measuring instrument may be used to measure the included angle $\theta_1$ and the included angle $\theta_2$.

In addition, the main supporting substrate 102 may include a flexible substrate or a non-flexible substrate. In some embodiments, the material of the main supporting substrate 102 may include, but is not limited to, metal, plastic, glass, quartz, sapphire, ceramic, carbon fiber, other suitable substrate materials, or a combination thereof. In some embodiments, the above metal material may include, but is not limited to, aluminum (Al), copper (Cu), molybdenum (Mo), silver (Ag), tin (Sn), tungsten (W), gold (Au), and chromium (Cr), nickel (Ni), platinum (Pt), aluminum alloy, copper alloy, molybdenum alloy, silver alloy, tin alloy, tungsten alloy, gold alloy, chromium alloy, nickel alloy, platinum alloy, other suitable metal materials, or a combination thereof. In some embodiments, the above plastic material may include, but is not limited to, polyimide (PI), polyethylene terephthalate (PET), polycarbonate (PC), other suitable materials, or a combination thereof. In addition, in some embodiments, the main supporting substrate 102 may include a metal-glass fiber composite plate, or a metal-ceramic composite plate, but it is not limited thereto.

Furthermore, the main supporting substrate 102 may have a thickness T. In some embodiments, the thickness T of the main supporting substrate 102 may be in a range from 500 micrometers (μm) to 5 millimeters (mm) (500 μm≤the thickness T≤5 mm), or from 1 millimeter to 4 millimeters, for example, 1.5 mm, 2 mm, 2.5 mm, 3 mm, or 3.5 mm, but it is not limited thereto. It should be understood that the thickness T may have other suitable ranges according to different types of display devices, and the present disclosure is not limited thereto.

In accordance with some embodiments, the thickness T of the main supporting substrate 102 may refer to the maximum thickness of the main supporting substrate 102 in a normal direction of the bottom surface 102b of the main supporting substrate 102 (e.g., the Z direction shown in the figure). In addition, it should be understood that if the thickness T of the main supporting substrate 102 is too thin (e.g., less than 500 μm), it may not provide sufficient support.

In accordance with the embodiments of the present disclosure, an optical microscopy (OM), a scanning electron microscope (SEM), a film thickness profiler (α-step), an ellipsometer, or another suitable means may be used to measure the thickness or length of the elements, or distance between the elements, but the present disclosure is not limited thereto. Specifically, in some embodiments, a scanning electron microscope may be used to obtain a cross-sectional image of the structure, and a suitable instrument may be used to measure the thickness or length of the elements, or distance between the elements in the image.

In addition, in some embodiments, the material of the display substrate 202 (the first display substrate 202A and the second display substrate 202B) may include, but is not limited to, plastic, glass, quartz, sapphire, ceramic, carbon fiber, other suitable substrate materials, or a combination thereof. In some embodiments, the above plastic material may include, but is not limited to, polyimide (PI), polyethylene terephthalate (PET), polycarbonate (PC), another suitable material, or a combination thereof. In addition, in some embodiments, the display substrate 202 may include a metal-glass fiber composite plate, or a metal-ceramic composite plate, but it is not limited thereto. In addition, the material of the main supporting substrate 102 may be the same as or different from the material of the display substrate 202.

Furthermore, in some embodiments, a grinding process, a lapping process, a polishing process, a milling process, or a combination thereof may be performed on the main supporting substrate 102 to form the optical structure 100R. In some other embodiments, the main supporting substrate 102 having the optical structure 100R may be formed by the processes using such as molds and injection molding, but it is not limited thereto.

Figure 3:
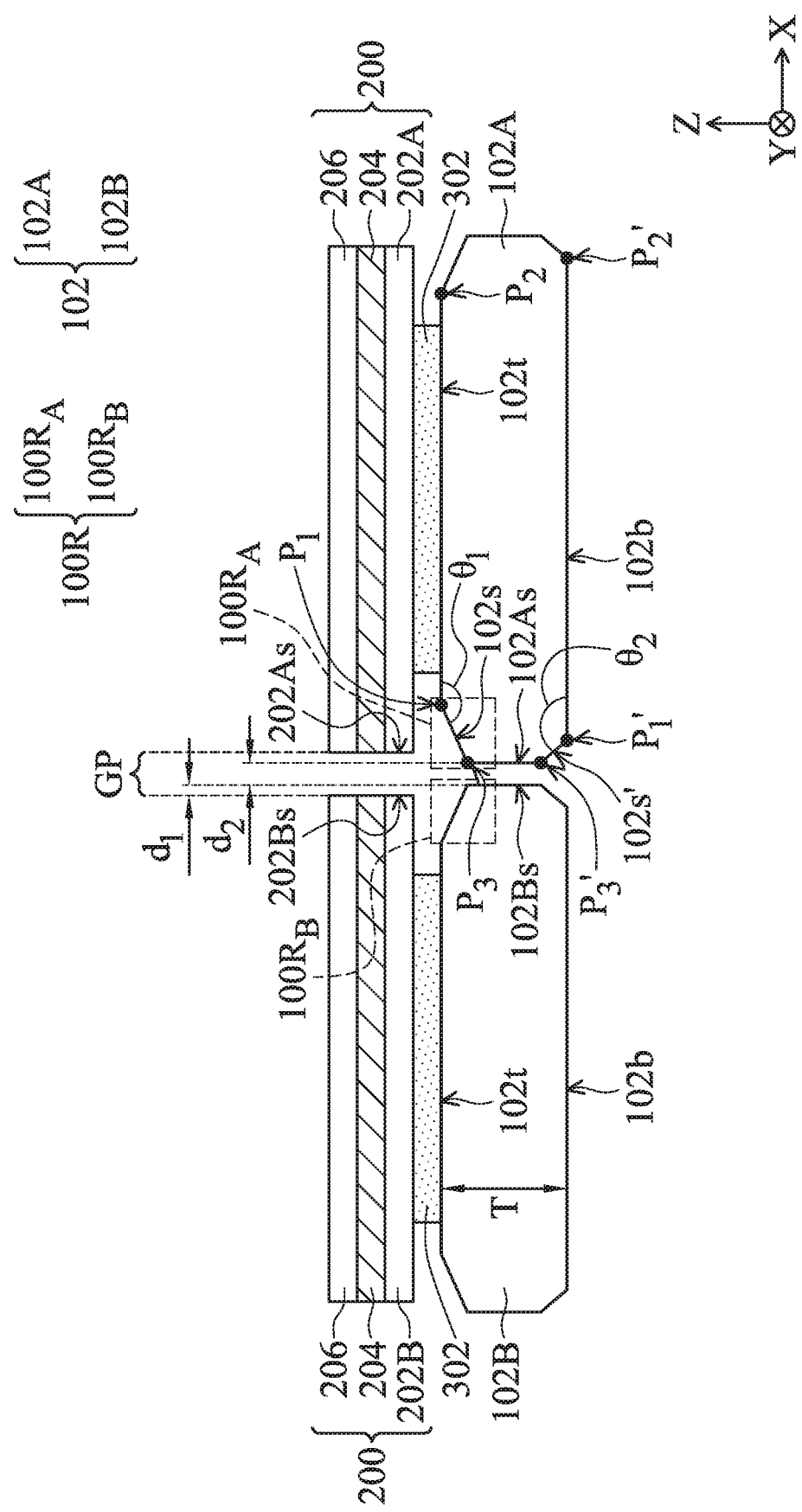

Next, referring to FIG. 3, which is a cross-sectional diagram along section line A-A' in FIG. 1 in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIG. 3, in accordance with some embodiments, the main supporting substrate 102 may include a plurality of sub-supporting substrates. For example, in some embodiments, the main supporting substrate 102 may include a first sub-supporting substrate 102A and a second sub-supporting substrate 102B, the first display substrate 202A may be disposed on the first sub-supporting substrate 102A, and the second display substrate 202B may be disposed on the second sub-supporting substrate 102B.

In some embodiments, the optical structure 100R of the tiled display device 10 may include a first portion $100R_A$ and a second portion $100R_B$, the first portion $100R_A$ may be a part of the first sub-supporting substrate 102A, and the second portion $100R_B$ may be a part of the second sub-supporting substrate 102B. In addition, the first portion $100R_A$ and the second portion $100R_B$ of the optical structure 100R may also be at least partially overlapped with the gap GP in a top-view direction of the tiled display device 10 (e.g., the Z direction shown in the figure).

In some embodiments, the first portion $100R_A$ may be located in the upper portion of the first sub-supporting substrate 102A, and the second portion $100R_B$ may be located in the upper portion of the second sub-supporting substrate 102B. In some embodiments, the first portion $100R_A$ and the second portion $100R_B$ of the optical structure 100R may include a chamfer structure.

Specifically, each of the first sub-supporting substrate 102A and the second sub-supporting substrate 102B may include a top surface 102t and a side surface 102s that is connected to the top surface 102t. In addition, the side surfaces 102s may not be perpendicular to the top surfaces 102t, so that the side surfaces 102s may serve as the first portion $100R_A$ and the second portion $100R_B$ of the optical structure 100R, respectively. As mentioned above, since the side surfaces 102s and the top surfaces 102t of the first sub-supporting substrate 102A and the second sub-supporting substrate 102B are not perpendicular (including the chamfered structure), the reflection light generated when the light L reaches the first sub-supporting substrate 102A and the second sub-supporting substrate 102B may be effectively reduced.

In addition, the side surfaces 102s of the first sub-supporting substrate 102A and the second sub-supporting substrate 102B are side surfaces that are at least partially overlapped with the gap GP. In some embodiments, there may be an included angle $\theta_1$ between the top surface 102t and the side surface 102s in the first sub-supporting substrate 102A and the second sub-supporting substrate 102B. In some embodiments, the range of the included angle $\theta_1$ may be greater than 135 degrees and less than 180 degrees (135 degrees<included angle $\theta_1$<180 degrees), or greater than 140 degrees and less than 170 degrees, for example, 145 degrees, 150 degrees, 155 degrees, 160 degrees, or 165 degrees, but it is not limited thereto.

Specifically, in accordance with some embodiments, the included angle $\theta_1$ may refer to an included angle that is formed by a connection line between an end point $P_1$ and an end point $P_2$ on the top surfaces 102t of the first sub-supporting substrate 102A and the second sub-supporting substrate 102B (e.g., the two end points or turning points of the top surfaces 102t in a cross-sectional structure) and a connection line between the end point $P_1$ and another end point $P_3$ on the side surfaces 102s (e.g., the end points or turning points of the side surfaces 102s in a cross-sectional structure, or the end points or turning points where the side surfaces 102AS connect the side surfaces 102s in a cross-sectional structure).

Furthermore, as shown in FIG. 3, in some embodiments, the lower portion of the first sub-supporting substrate 102A and/or the second sub-supporting substrate 102B may also have the chamfered structure. In some embodiments, the first sub-supporting substrate 102A and the second sub-supporting substrate 102B each may include a bottom surface 102b and a side surface 102s' that is connected to the bottom surface 102b, and the side surface 102s' is not perpendicular to the bottom surface 102b. In accordance with some embodiments, the first supporting substrate 102A and the second supporting substrate 102B may have the chamfered structure at the lower portion, and thereby the efficiency of the subsequent assembly process of the tiled display device 10 may be improved.

In some embodiments, the side surfaces 102s' of the first sub-supporting substrate 102A and the second sub-supporting substrate 102B are side surfaces that are at least partially overlapped with the gap GP. In some embodiments, there may be an included angle $\theta_2$ between the bottom surface 102b and the side surface 102s' in the first sub-supporting substrate 102A and the second sub-supporting substrate 102B. In some embodiments, the range of the included angle $\theta_2$ may be greater than 90 degrees and less than 180 degrees (90 degrees<the included angle $\theta_2$ 180 degrees). In some embodiments, the range of the included angle $\theta_2$ may be equal to 90 degrees (i.e. without the chamfer). In addition, the included angle $\theta_1$ may be the same as or different from the included angle $\theta_2$.

In accordance with some embodiments, the included angle $\theta_2$ may refer to an included angle that is formed by a connection line between an end point $P_1$' and an end point $P_2$' on the bottom surfaces 102b in the first sub-supporting substrate 102A and the second sub-supporting substrate 102B (e.g., the two end points or turning points of the bottom surfaces 102b in a cross-sectional structure) and a connection line between the end point $P_1$' and another end point $P_3$' on the side surfaces 102s' (e.g., the end points or turning points of the side surfaces 102s', or the end points or turning points where the side surfaces 102AS connect the side surfaces 102s' in a cross-sectional structure).

As shown in FIG. 3, in some embodiments, the first sub-supporting substrate 102A may have another side surface 102As, the second sub-supporting substrate 102B may have another side surface 102Bs, and the side surface 102As and the side surface 102Bs may be disposed opposite to each other. In addition, the side surface 102As and the side surface 102Bs may also be at least partially overlapped with the gap GP.

In some embodiments, the side surface 102As of the first sub-supporting substrate 102A and the side surface 202As of the first display substrate 202A may be spaced apart by a distance $d_1$. That is, compared to the side surface 202As of the first display substrate 202A, the side surface 102As of the first supporting substrate 102A may protrude outward by the distance $d_1$. In some embodiments, compared to the outer side surface of the first display substrate 202A (the surface opposite to the side surface 202As, not labeled in the figure), the outer side surface of the first sub-supporting substrate 102A (the surface opposite to the side surface 102As, not labeled in the figure) may also protrude outward by a distance. In some embodiments, the side surface 102Bs of the second sub-supporting substrate 102B and the side surface 202Bs of the second display substrate 202B may be may be spaced apart by a distance $d_1$. That is, compared to the side surface 202Bs of the second display substrate 202B, the side surface 102Bs of the second sub-supporting substrate 102B may protrude outward by the distance $d_1$. In some embodiments, the distance $d_1$ may be less than one-half of the pixel pitch of the light-emitting units (not illustrated) in the display element 200 (i.e. $d_1$<½× the pixel pitch), so that the light-emitting units may still maintain a consistent pixel pitch at the gap GP (the tiled position).

Therefore, the user's perception of a seam at the gap GP may be reduced and the display quality may be improved.

Specifically, in some embodiments, the distance $d_1$ may be in a range from 10 μm to 3 mm (10 μm≤the distance $d_1$≤3 mm), from 50 μm to 250 μm, or from 100 μm to 200 μm. However, it should be understood that the distance $d_1$ may have other suitable ranges according to different types of display devices, and the present disclosure is not limited thereto.

In accordance with some embodiments, the distance $d_1$ may refer to the minimum distance between the side surface 102As of the first sub-supporting substrate 102A and the side surface 202As of the first display substrate 202A, or the minimum distance between the side surface 102Bs of the second sub-supporting substrate 102B and the side surface 202Bs of the second display substrate 202B in a direction that is perpendicular to the top-view direction of the tiled display device 10 (e.g., the X direction shown in the figure). In addition, the top-view direction may be, for example, the Z direction in a cross-sectional diagram (such as FIG. 3). In some embodiments, the distance $d_1$ of the first sub-supporting substrate 102A may be the same as or different from the distance $d_1$ of the second sub-supporting substrate 102B.

In addition, in some embodiments, the first sub-supporting substrate 102A and the second sub-supporting substrate 102B may be spaced apart by a distance $d_2$, and the distance $d_2$ may be smaller than the gap GP between the first display substrate 202A and the second display substrate 202B. In some embodiments, the distance $d_2$ may be close to zero, that is, the first sub-supporting substrate 102A may be relatively close to the second sub-supporting substrate 102B. In some embodiments, the distance $d_2$ may approach or be equal to zero, that is, the first sub-supporting substrate 102A may be in contact with the second sub-supporting substrate 102B. When the distance $d_2$ is smaller than the gap GP, the risk of collision and crack due to excessive proximity between the display elements 200 during assembly may be reduced.

In accordance with some embodiments, the distance $d_2$ may refer to the minimum distance between the side surface 102As of the first sub-supporting substrate 102A and the side surface 102Bs of the second sub-supporting substrate 102B in a direction that is perpendicular to the top-view direction of the tiled display device 10 (e.g., the X direction shown in the figure). In addition, the top-view direction may be, for example, the Z direction in a cross-sectional diagram (such as FIG. 3).

Figure 4:
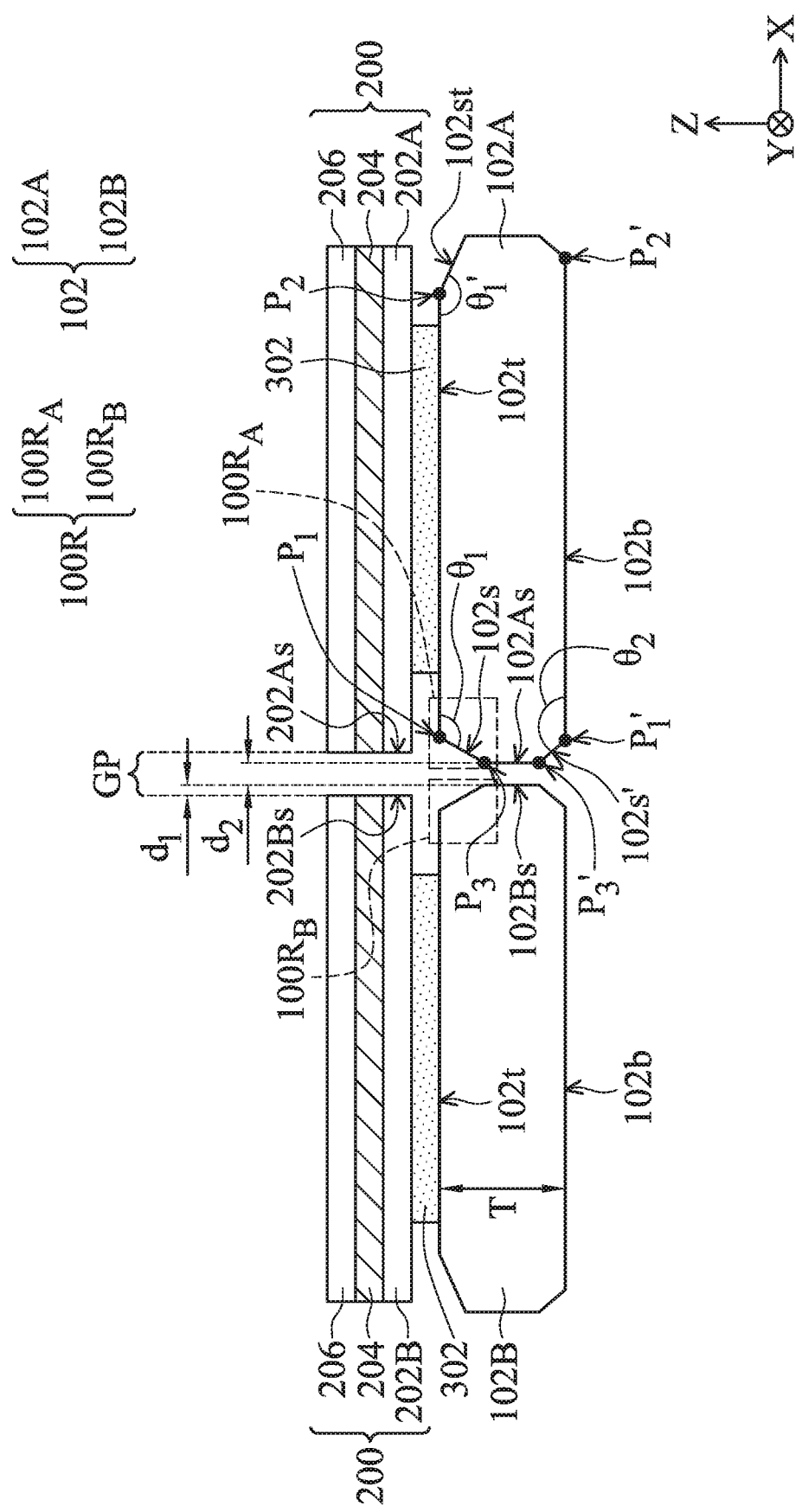

Next, referring to FIG. 4, which is a cross-sectional diagram along section line A-A' in FIG. 1 in accordance with some other embodiments of the present disclosure. As shown in FIG. 4, in some embodiments, the included angle $\theta_1$ between the top surface 102t and the side surface 102s in the first sub-supporting substrate 102A and the second sub-supporting substrate 102B may be greater than 90 degrees and less than 135 degrees (90 degrees<included angle $\theta_1$<135 degrees), or greater than 100 degrees and less than 120 degrees, for example, 95 degrees, 100 degrees, 105 degrees, 110 degrees, or 115 degrees, but it is not limited thereto.

Similarly, as shown in FIG. 4, in some embodiments, the optical structure 100R may include a first portion $100R_A$ and a second portion $100R_B$, and the first portion $100R_A$ and the second portion $100R_B$ may be respectively located on the upper portions of the first sub-supporting substrate 102A and the second sub-supporting substrate 102B. In addition, in this embodiment, the side surfaces 102s and the top surfaces 102t of the first sub-supporting substrate 102A and the second sub-supporting substrate 102B are not perpendicular (including the chamfered structure), and therefore the reflection light generated when the light L reaches the first sub-supporting substrate 102A and the second sub-supporting substrate 102B may be effectively reduced. This may accordingly reduce the occurrence of bright lines at the gap GP, which can affect image quality.

Furthermore, in some embodiments, there may be an included angle $\theta_1'$ between the top surface 102t and another side surface 102st (the side surface located at the outer side) of the first sub-supporting substrate 102A. In some embodiments, the included angle $\theta_1'$ may be the same as or different from the included angle $\theta_1$. In accordance with some embodiments, the included angle $\theta_1'$ and the included angle $\theta_1$ of the second sub-supporting substrate 102B may also have the relationship described above.

Figure 5:
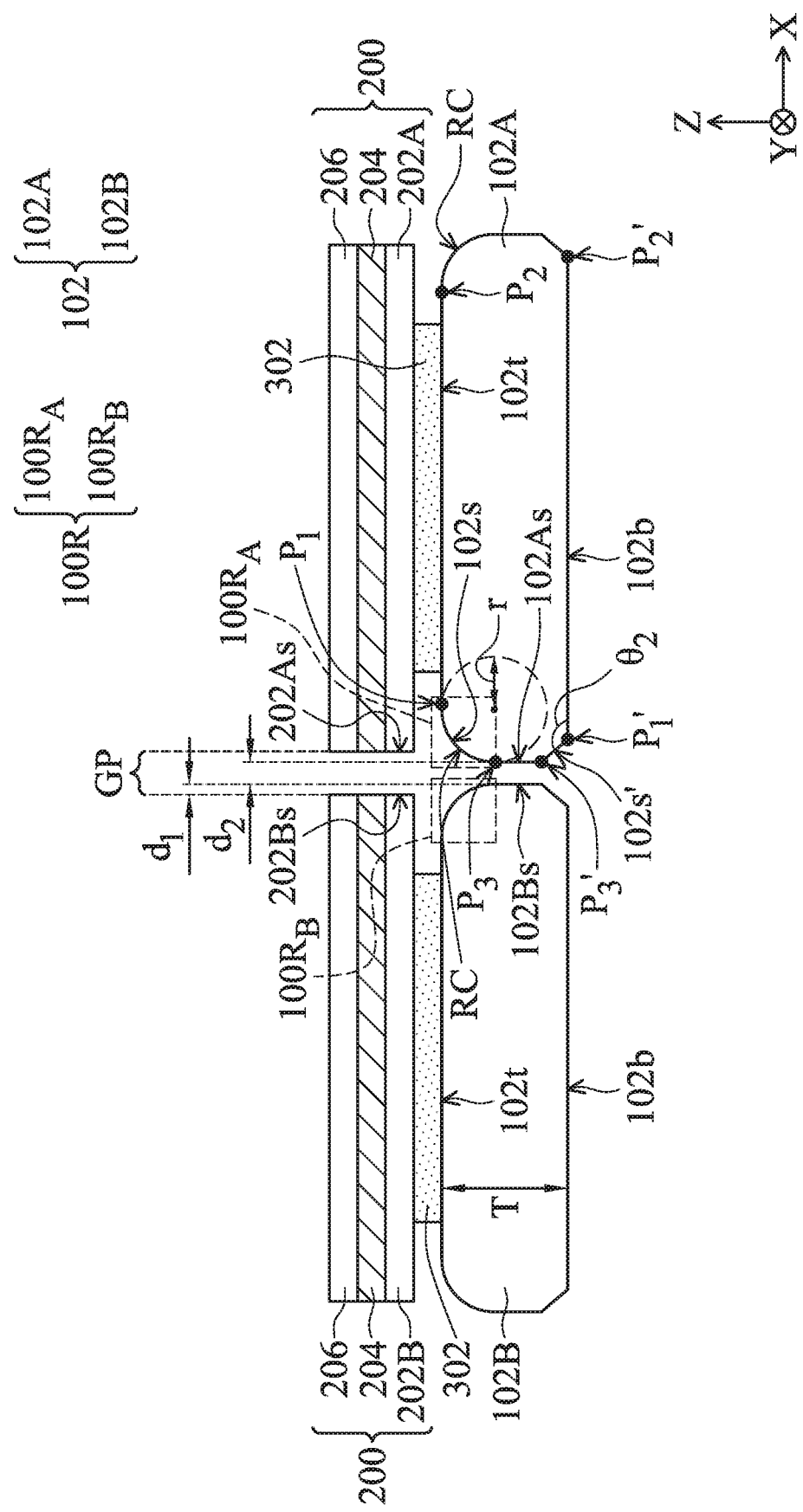

Next, referring to FIG. 5, which is a cross-sectional diagram along section line A-A' in FIG. 1 in accordance with some other embodiments of the present disclosure. As shown in FIG. 5, in some embodiments, the side surfaces 102s of the first sub-supporting substrate 102A and the second sub-supporting substrate 102B may include a curved surface portion RC. In some embodiments, the curved surface portion RC of the side surface 102s may have a radius of curvature r. The aforementioned "curved surface portion" may refer to a portion between a region that starts to be substantially non-parallel to the top surface 102t to a region that starts to be substantially non-parallel to a side surface (for example, the side surface 102As or the side surface 102Bs). In some embodiments, the radius of curvature r may be greater than or equal to the distance $d_1$ between the side surface 102As of the first sub-supporting substrate 102A and the side surface 202As of the first display substrate 202A, and the radius of curvature r may be less than or equal to the thickness T of the first sub-supporting substrate 102A and the second sub-supporting substrate 102B (that is, $d_1 \leq$ the radius of curvature $r \leq T$).

In some embodiments, the radius of curvature r may refer to the radius of curvature of a curve that is between the end point $P_1$ on the top surface 102t of the first sub-supporting substrate 102A and another end point $P_3$ on the side surface 102s (e.g., the end point $P_1$ and end point $P_3$ in a cross-sectional structure). Specifically, in this embodiment, the end point $P_1$ may be substantially an end point where the curvature on the top surface 102t starts to be not zero, and the end point $P_3$ may be substantially an end point where the curvature on the side surface 102s starts to be not zero.

In this embodiment, the side surfaces 102s (including the curved surface portion RC) and the top surfaces 102t of the first sub-supporting substrate 102A and the second sub-supporting substrate 102B are not perpendicular, and therefore the reflection light generated when the light L reaches the first sub-supporting substrate 102A and the second sub-supporting substrate 102B may be effectively reduced. This may accordingly reduce the occurrence of bright lines at the gap GP, which impact image quality.

Figure 6:
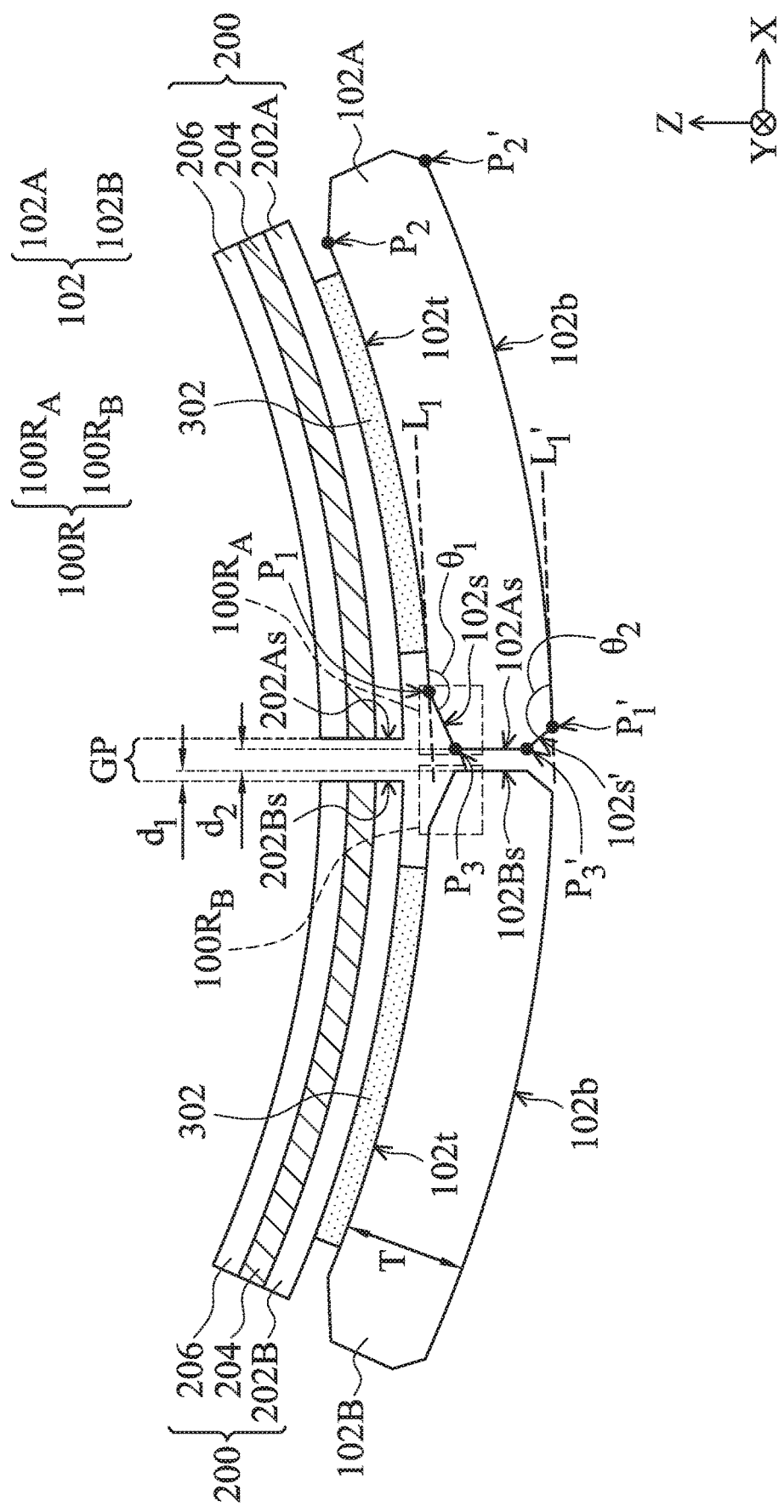

Next, referring to FIG. 6, which is a cross-sectional diagram along section line A-A' in FIG. 1 in accordance with some other embodiments of the present disclosure. As shown in FIG. 6, In accordance with some embodiments, the tiled display device 10 may be a curved tiled display. In some embodiments, the first sub-supporting substrate 102A and the second sub-supporting substrate 102B may be curved. In some embodiments, the first sub-supporting substrate 102A and the second sub-supporting substrate 102B may have a fixed curvature.

In some embodiments, the first sub-supporting substrate 102A and the second sub-supporting substrate 102B may be tiled together to form a concave display structure. For example, the horizontal position of the end point $P_2$ may be higher than the horizontal position of the end point $P_1$ on the top surface 102t of the first sub-supporting substrate 102A. In addition, in this embodiment, the included angle $\theta_1$ may refer to an included angle formed between the tangent line $L_1$ at the end point $P_1$ on the top surface 102t of the first sub-supporting substrate 102A (which refers to the tangent line on the top surface 102t that passes through the end point $P_1$) and the side surface 102s. Similarly, in this embodiment, the included angle $\theta_2$ may refer to an included angle formed between the tangent line $L_1'$ at the end point $P_1'$ on the bottom surface 102b of the first sub-supporting substrate 102A and the side surface 102s'. Furthermore, in accordance with some embodiments, the included angle $\theta_1$ and the included angle $\theta_2$ of the second sub-supporting substrate 102B may also be defined in the manner as described above.

Figure 7:
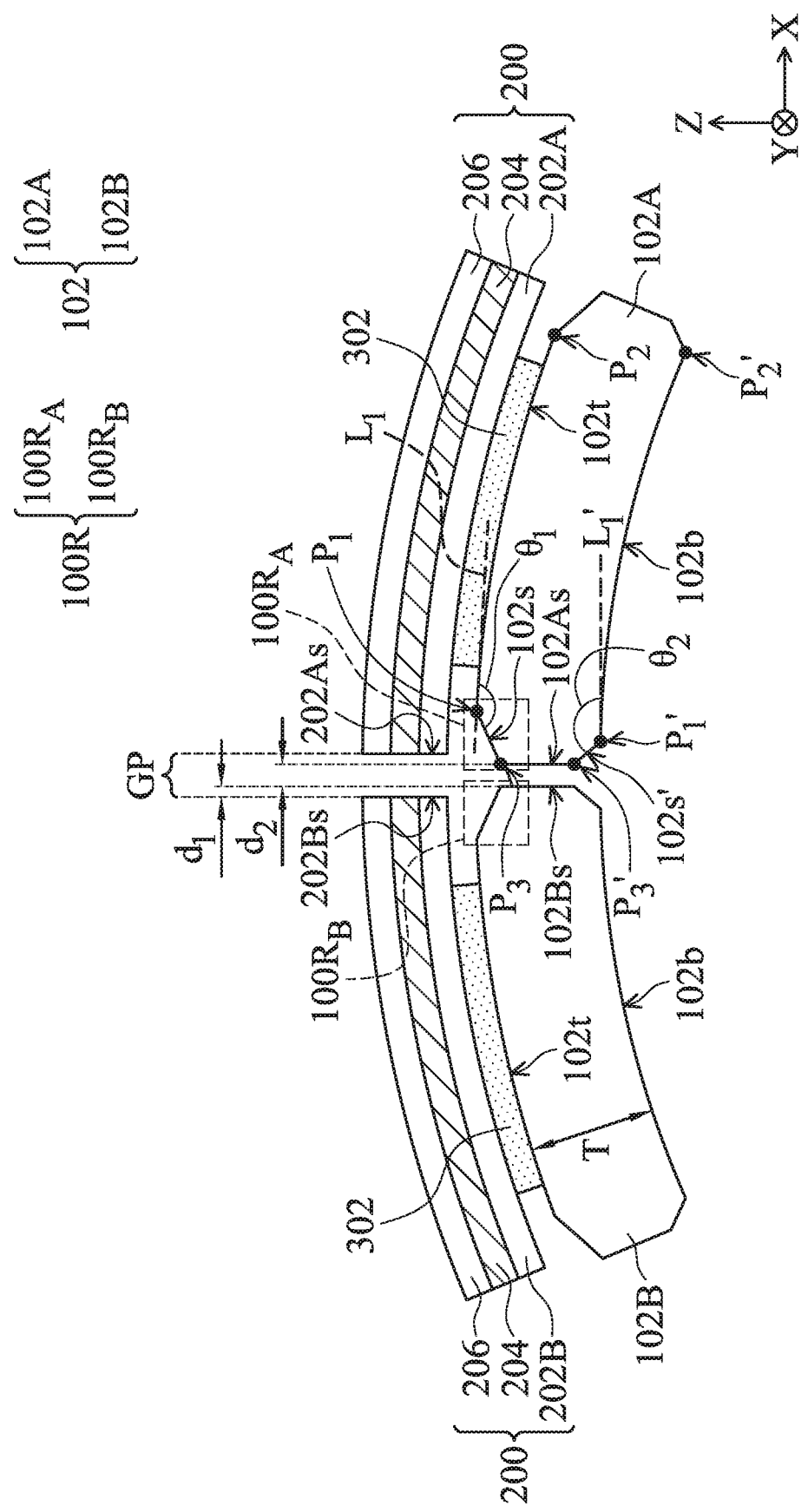

Next, referring to FIG. 7, which is a cross-sectional diagram along section line A-A' in FIG. 1 in accordance with some other embodiments of the present disclosure. As shown in FIG. 7, in accordance with some embodiments, the tiled display device 10 may be a curved tiled display. In some embodiments, the first sub-supporting substrate 102A and the second sub-supporting substrate 102B may be curved. In some embodiments, the first sub-supporting substrate 102A and the second sub-supporting substrate 102B may have a fixed curvature.

In some embodiments, the first sub-supporting substrate 102A and the second sub-supporting substrate 102B may be tiled together to form a convex display structure. In addition, in this embodiment, the definitions of the included angle $\theta_1$ and the included angle $\theta_2$ are the same as those described in the embodiment shown in FIG. 6, and thus are not repeated herein.

Figure 8:
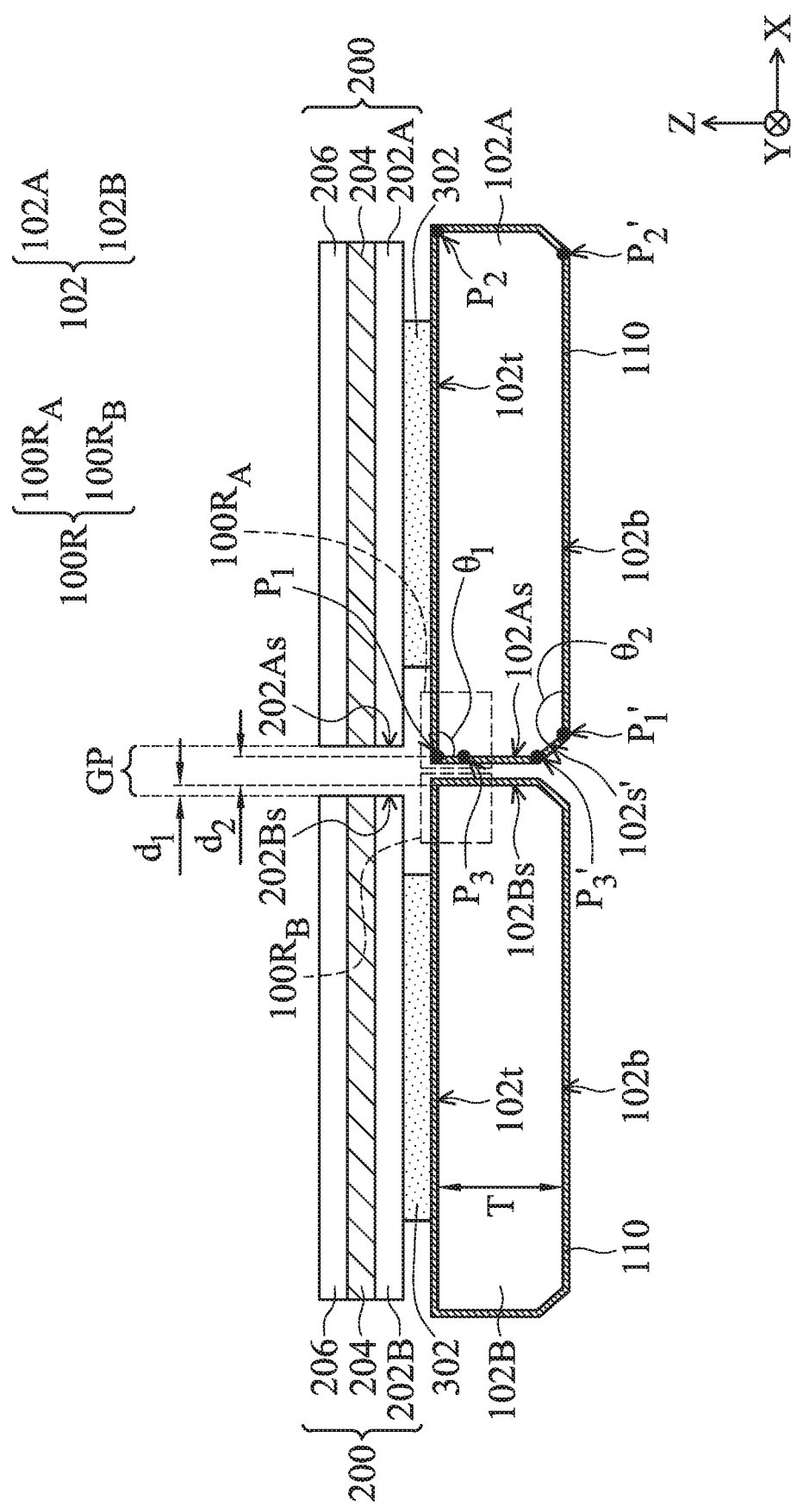

Next, referring to FIG. 8, which is a cross-sectional diagram along section line A-A' in FIG. 1 in accordance with some other embodiments of the present disclosure. As shown in FIG. 8, in accordance with some embodiments, the first portion $100R_A$ and the second portion $100R_B$ of the optical structure 100R may include a cover layer 110, and the cover layer 110 may be used to absorb part of light. In some embodiments, the cover layer 110 may be a dark layer which has a dark color. In other words, in some embodiments, a portion of the top surfaces 102t and a portion of the side surfaces 102As and the side surfaces 102Bs of the first sub-supporting substrate 102A and the second sub-supporting substrate 102B may have cover layers 110 formed thereon. In addition, in a top-view direction of the tiled display device 10 (e.g., the Z direction shown in the figure), the cover layer 110 may be overlapped with the gap GP. In some other embodiments, the cover layer 110 may substantially cover the entire first sub-supporting substrate 102A and the entire second sub-supporting substrate 102B. The cover layer 110 may absorb part of the light and reduce the reflected light generated at the gap GP.

In addition, in some embodiments, the included angle $\theta_1$ between the top surface 102t and the side surface 102As of the first sub-supporting substrate 102A may be substantially 90 degrees or 135 degrees, and parts of the top surface 102t, and parts of the side surface 102As and side surface 102Bs of the first sub-supporting substrate 102A and the second sub-supporting substrate 102B may have the cover layer 110 formed thereon. In these embodiments, although the included angle $\theta_1$ may be 90 degrees or 135 degrees, the cover layer 110 formed on parts of the top surface 102t, and parts of the side surface 102As and the side surface 102Bs of the first sub-supporting substrate 102A and the second sub-supporting substrate 102B may serve as the optical structure 100R. Therefore, such configurations can still effectively reduce the reflected light generated when the light L reaches the first sub-supporting substrate 102A and the second sub-supporting substrate 102B.

In addition, it should be understood that, in some embodiments, the cover layer 110 may also be applied to the embodiments including a single main supporting substrate 102 as shown in FIG. 2.

In some embodiments, the reflectance of the cover layer 110 (dark layer) may be in a range from 0% to 10% (0%≤the reflectance≤10%), from 0.001% to 5%, or from 0.01% to 0.5%. The term "reflectance" described herein may refer to the percentage of the spectral integration value of the reflected light of the light source (e.g., which may be ambient light) divided by the spectral integration value of the incident light. In some embodiments, the light source may include visible light (e.g., the wavelength is from 380 nm to 780 nm) or ultraviolet light (e.g., the wavelength is less than 365 nm), but it is not limited thereto. For example, when the light source is visible light, the reflectance of the cover layer or the dark layer may refer to the percentage of the spectral integration value of the reflected light in the wavelength ranging from 380 nm to 780 nm divided by the spectral integration value of the incident light in the same wavelength range is between 0% and 10%. In other words, in some embodiments, the absorption rate of the cover layer 110 may be in a range from 90% to 100% (90%≤the absorption rate≤100%), from 95% to 100%, or from 97% to 100%. In some embodiments, the cover layer 110 may include a matrix and cover pigments formed in the matrix, but the present disclosure is not limited thereto. In some embodiments, the matrix may include, but is not limited to, organic resin, glass paste, other suitable materials, or a combination thereof.

In some embodiments, a chemical vapor deposition process, a coating process, an evaporation process, a sputtering process, a laminating process, a printing process, or another suitable process may be used to form the cover layer 110 on the first sub-supporting substrate 102A and the second sub-supporting substrate 102B, but the present disclosure is not limited thereto. In addition, in some embodiments where the first sub-supporting substrate 102A and the second sub-supporting substrate 102B include aluminum, the cover layer 110 may be formed by an anodized aluminum oxide (AAO) process.

Figure 9:
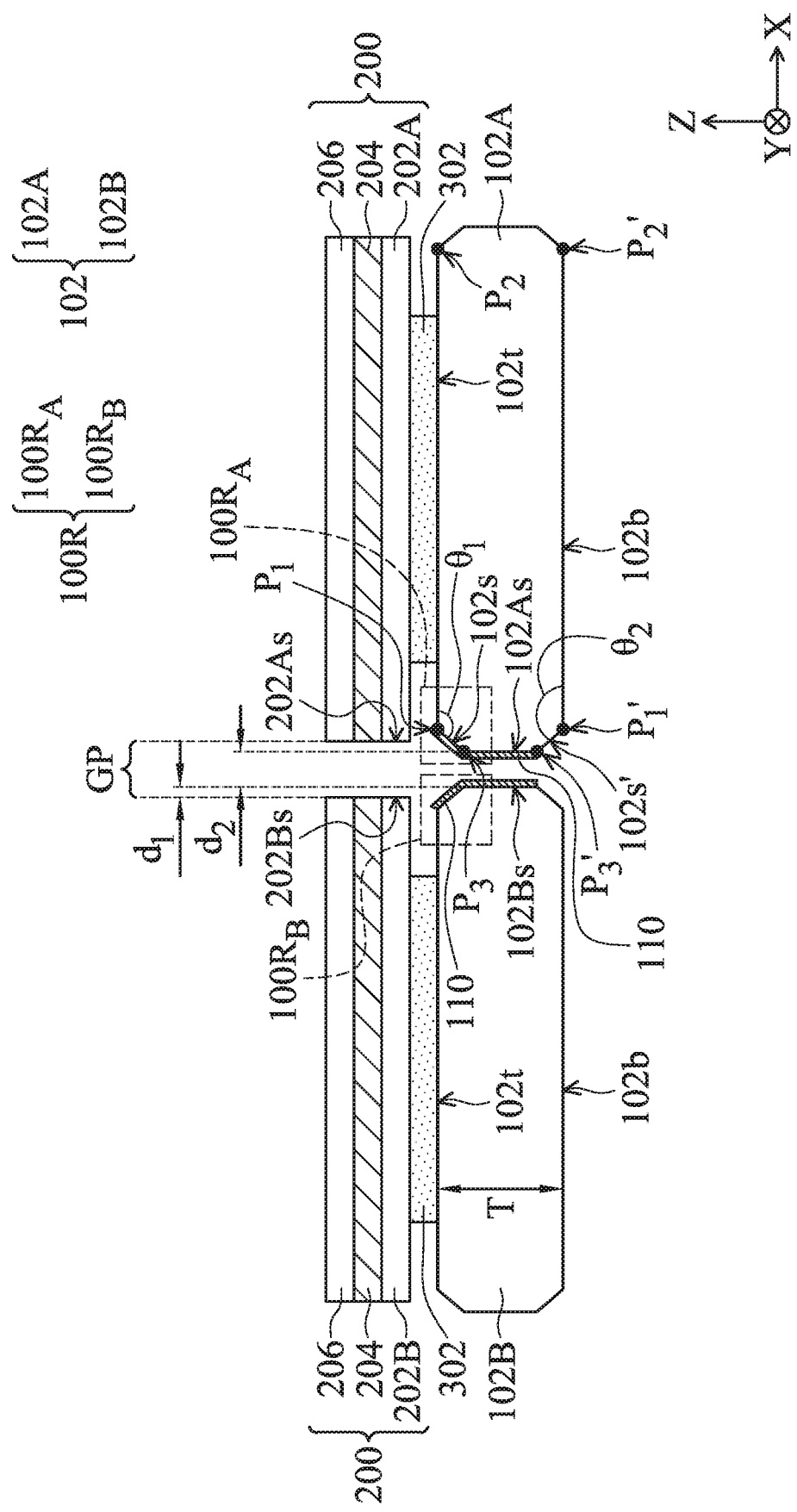

Next, referring to FIG. 9, which is a cross-sectional diagram along section line A-A' in FIG. 1 in accordance with some other embodiments of the present disclosure. As shown in FIG. 9, in accordance with some embodiments, the cover layer 110 may be formed on the side surface 102s and the side surface 102As of the first sub-supporting substrate 102A, but not formed on other surfaces of the first sub-supporting substrate 102A. Similarly, in accordance with some embodiments, the cover layer 110 may be formed on the side surface 102s and the side surface 102Bs of the second sub-supporting substrate 102B, but not formed on other surfaces of the second sub-supporting substrate 102B. Furthermore, in these embodiments, the cover layer 110 may also be at least partially overlapped with the gap GP in a top-view direction of the tiled display device 10 (e.g., the Z direction shown in the figure).

Figure 10:
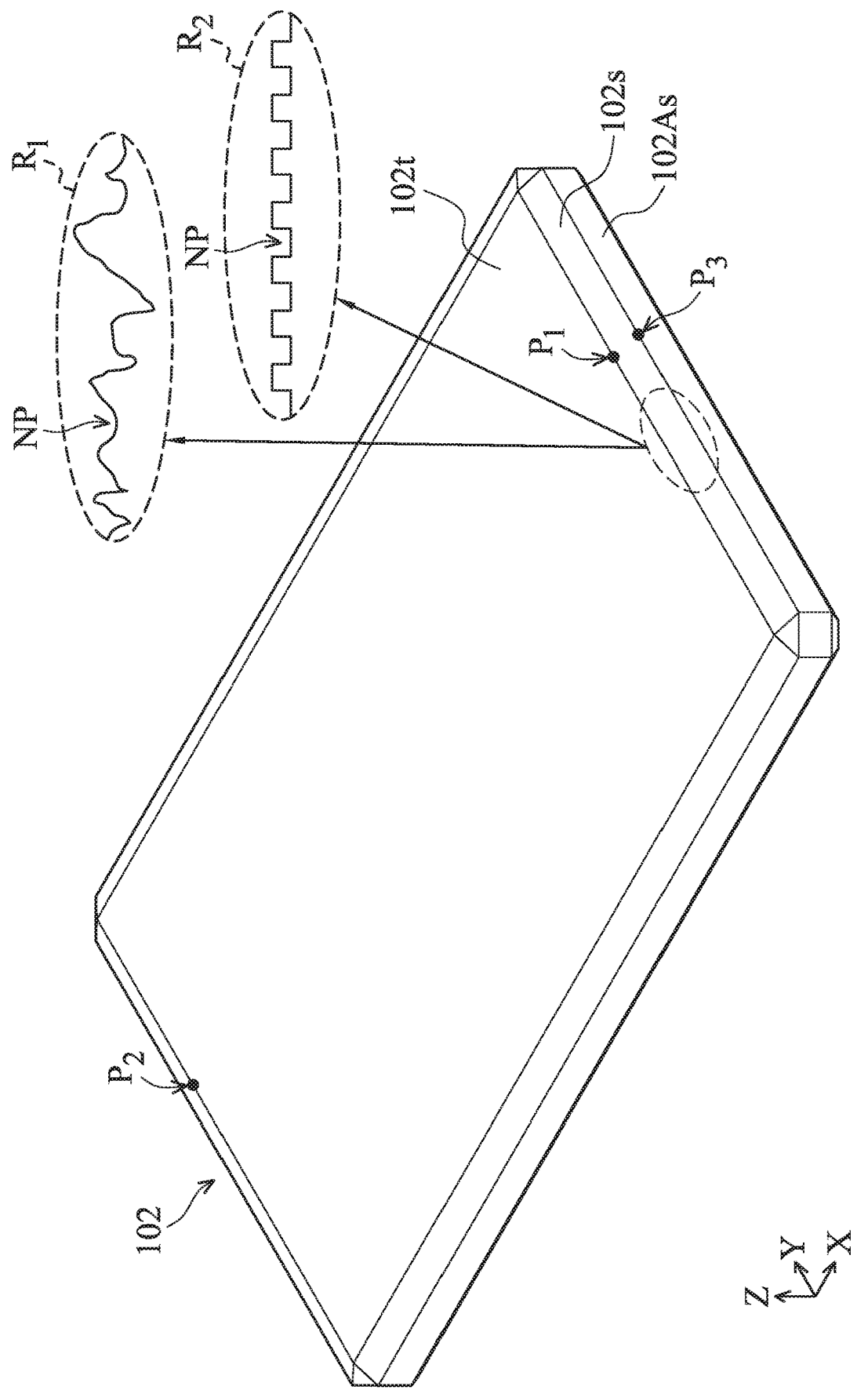
FIG. 10 is a structural diagram of the main supporting substrate of the tiled display device in accordance with some embodiments of the present disclosure.

Next, referring to FIG. 10, which is a structural diagram of the main supporting substrate 102 of the tiled display device 10 in accordance with some embodiments of the present disclosure. As shown in FIG. 10, in accordance with some embodiments, the optical structure 100R (not labeled in the figure) (e.g., the first portion $100R_A$ or the second portion $100R_B$) may include a non-planar surface NP. Although the numerals of some elements are not shown in FIG. 10, the drawings provided above (for example, FIG. 3) can be used to understand FIG. 10 and the following description.

In addition, the end point $P_1$ and the end point $P_2$ (e.g., the two end points or turning points of the top surface 102t) and the end point $P_3$ (e.g., the end points or turning points of the side surface 102s, or the end points or turning points where the side surface 102As connected to the side surface 102s) are shown in FIG. 10 to specify the endpoint defined in the embodiments of the present disclosure more clearly.

In some embodiments, parts of the top surface 102t and parts of the side surface 102As and the side surface 102s of the main supporting substrate 102 (or the first sub-supporting substrate 102A and the second sub-supporting substrate 102B) may have non-planar surfaces NP. In some embodiments, the non-planar surface NP may include a corrugated surface, a concave-convex surface, other non-planar surface morphologies, or a combination thereof. In addition, the surface morphology of the non-planar surface NP may be irregular (as shown in region $R_1$) or regular (as shown in region $R_2$).

In addition, it should be understood that, in some embodiments, the non-planar surface NP may also be applied to the embodiments including a single main supporting substrate 102 shown in FIG. 2.

In some embodiments, the roughness Ra of the non-planar surface NP may be in a range from 0.05 μm to 50 μm (0.05 μm≤Ra≤50 μm), from 1 μm to 40 μm, or from 10 μm to 30 μm, for example, 15 μm, 20 μm, or 25 μm. In accordance with some embodiments, the roughness of the non-planar surface NP may be measured by an atomic force microscope, a surface roughness meter, a white light interferometer, a laser microscope, or other instruments capable of measuring roughness.

In some embodiments, a surface roughening treatment may be performed on the main supporting substrate 102 (or the first sub-supporting substrate 102A and the second sub-supporting substrate 102B) by using a mechanical or chemical method so that it can have a suitable roughness and to form the non-planar surface NP. In addition, in some embodiments where the material of the substrate includes aluminum, the non-planar surface NP may be formed by an anodized aluminum oxide (AAO) process.

To summarize the above, in accordance with some embodiments of the present disclosure, the provided tiled display device includes the optical structure. The optical structure can reduce the reflected light generated by the ambient light at the connection position (tiled position) of the display, and reduce the interference of the ambient light on the image quality of the display. In accordance with some embodiments, the optical structure may be, for example, a light reflection reduction structure.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. A tiled display device, comprising:
   a main supporting substrate comprising a first top surface and a first side surface that is connected to the first top surface;
   a first display substrate disposed on the main supporting substrate; and
   a second display substrate disposed on the main supporting substrate and adjacent to the first display substrate;
   wherein the main supporting substrate comprises a light reflection reduction structure, and in a top-view direction of the tiled display device, the light reflection reduction structure is overlapped with a gap between the first display substrate and the second display substrate,
   wherein the first side surface is not perpendicular to the first top surface, and the first side surface is at least partially overlapped with the gap.

2. The tiled display device as claimed in claim 1, wherein an included angle between the first top surface and the first side surface is greater than 135 degrees and less than 180 degrees.

3. The tiled display device as claimed in claim 1, wherein an included angle between the first top surface and the first side surface is greater than 90 degrees and less than 135 degrees.

4. The tiled display device as claimed in claim 1, the main supporting substrate comprising a first sub-supporting substrate and a second sub-supporting substrate, wherein the first display substrate is disposed on the first sub-supporting substrate and the second display substrate is disposed on the second sub-supporting substrate.

5. The tiled display device as claimed in claim 4, wherein a distance between the first sub-supporting substrate and the second sub-supporting substrate is smaller than the gap between the first display substrate and the second display substrate.

6. The tiled display device as claimed in claim 4, wherein the first sub-supporting substrate and the second sub-supporting substrate are tiled to form a concave display structure or a convex display structure.

7. The tiled display device as claimed in claim 4, wherein a first portion of the light reflection reduction structure is a part of the first sub-supporting substrate, and a second portion of the light reflection reduction structure is a part of the second sub-supporting substrate.

8. The tiled display device as claimed in claim 7, the first sub-supporting substrate comprising a second top surface and a third side surface that is connected to the second top surface, wherein the third side surface is not perpendicular to the second top surface, and the third side surface is the first portion of the light reflection reduction structure.

9. The tiled display device as claimed in claim 8, wherein an included angle between the second top surface and the third side surface is greater than 135 degrees and less than 180 degrees.

10. The tiled display device as claimed in claim 8, wherein an included angle between the second top surface and the third side surface is greater than 90 degrees and less than 135 degrees.

11. The tiled display device as claimed in claim 8, wherein the third side surface of the first sub-supporting substrate is at least partially overlapped with the gap.

12. The tiled display device as claimed in claim 8, wherein compared to a fourth side surface of the first display substrate, the third side surface of the first supporting substrate protrudes outward by a distance.

13. The tiled display device as claimed in claim 12, wherein the distance is in a range from 10 μm to 3 mm.

14. The tiled display device as claimed in claim 8, wherein the third side surface comprises a curved surface portion.

15. The tiled display device as claimed in claim 14, wherein the curved surface portion of the third side surface has a radius of curvature, the radius of curvature is greater than or equal to a distance between the third side surface of the first sub-supporting substrate and a fifth side surface of the first display substrate, and the radius of curvature is less than or equal to a thickness of the first sub-supporting substrate.

16. The tiled display device as claimed in claim 8, wherein the second portion of the light reflection reduction structure comprises a dark layer, a non-planar surface, or a combination thereof.

17. The tiled display device as claimed in claim 16, wherein a reflectance of the dark layer is in a range from 0% to 10%, and a roughness of the non-planar surface is in a range from 0.05 μm to 50 μm.

18. The tiled display device as claimed in claim 1, wherein the light reflection reduction structure comprises a dark layer, a non-planar surface, or a combination thereof.

19. A tiled display device, comprising:
   a main supporting substrate comprising a first sub-supporting substrate and a second sub-supporting substrate, and the first sub-supporting substrate comprising a bottom surface and a side surface that is connected to the bottom surface;
   a first display substrate disposed on the main supporting substrate; and
   a second display substrate disposed on the main supporting substrate and adjacent to the first display substrate;
   wherein the main supporting substrate comprises a light reflection reduction structure, and in a top-view direction of the tiled display device, the light reflection reduction structure is overlapped with a gap between the first display substrate and the second display substrate,
   wherein the first display substrate is disposed on the first sub-supporting substrate and the second display substrate is disposed on the second sub-supporting substrate, and the side surface is not perpendicular to the bottom surface, and the side surface is at least partially overlapped with the gap.

20. A tiled display device, comprising:
   a main supporting substrate comprising a first sub-supporting substrate and a second sub-supporting substrate, and the first sub-supporting substrate comprising a top surface and a side surface that is connected to the top surface;

a first display substrate disposed on the main supporting substrate; and a second display substrate disposed on the main supporting substrate and adjacent to the first display substrate;

wherein the main supporting substrate comprises a light reflection reduction structure, and in a top-view direction of the tiled display device, the light reflection reduction structure is overlapped with a gap between the first display substrate and the second display substrate, wherein the first display substrate is disposed on the first sub-supporting substrate and the second display substrate is disposed on the second sub-supporting substrate, a first portion of the light reflection reduction structure is a part of the first sub-supporting substrate, and a second portion of the light reflection reduction structure is a part of the second sub-supporting substrate, and the side surface is not perpendicular to the top surface, and the side surface is the first portion of the light reflection reduction structure.

* * * * *